United States Patent
Oh et al.

(10) Patent No.: US 8,723,703 B2
(45) Date of Patent: May 13, 2014

(54) METHOD AND APPARATUS FOR ENCODING AND DECODING STRUCTURED DATA

(75) Inventors: Bong Jin Oh, Daejeon (KR); Eui Hyun Paik, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 6 days.

(21) Appl. No.: 13/572,129

(22) Filed: Aug. 10, 2012

(65) Prior Publication Data

US 2013/0069806 A1    Mar. 21, 2013

(30) Foreign Application Priority Data

Sep. 19, 2011    (KR) .................. 10-2011-0094312

(51) Int. Cl.
*H03M 7/00* (2006.01)
*H03M 5/00* (2006.01)
*H03M 7/30* (2006.01)

(52) U.S. Cl.
CPC . *H03M 7/30* (2013.01); *H03M 7/00* (2013.01)
USPC .................. 341/55; 341/50; 341/51

(58) Field of Classification Search
CPC ........................................ H03M 7/00
USPC .................................. 341/50, 55, 51
See application file for complete search history.

(56) References Cited

U.S. PATENT DOCUMENTS 7,571,152 B2 *    8/2009    Thienot et al. ............. 1/1

FOREIGN PATENT DOCUMENTS

| KR | 10-2005-0023411 | 3/2005 |
| KR | 10-2006-0085907 | 7/2006 |

* cited by examiner

*Primary Examiner* — Jean B Jeanglaude
(74) *Attorney, Agent, or Firm* — Staas & Halsey LLP

(57) ABSTRACT

A method and apparatus for encoding structured data by fragmenting the structured data into fragments according to a configuration of the structured data and encoding the fragments to generate encoded fragments using a string table including strings contained in the structured data.

19 Claims, 6 Drawing Sheets

FIG.7A

```
- <ProgramInformation programId="crid://lguplus.com/00048321"fragmentId="0" fragment
  - <BasicDescription>
      <Title lang="kor" type="main">SISAWIDE LIVE YEOUIDO JOURNAL</Title>
      <ShortTitle lang='kor" type="main"/>
    - <Synopsis lang="kor" type="main">
        <![CDATA[No data ]]>
      <Synopsis>
      <Duration>PT01H00M00S</Duration>
    - <ExtendedDescription>
        <ExtendedItem name="content_nibble_level_1">0</ExtendedItem>
        <ExtendedItem name="content_nibble_level_2">12</ExtendedItem>
        <ExtendedItem name="user_nibble">0</ExtendedItem>
        <ExtendedItem name="user_nibble">3</ExtendedItem>
        <ExtendedItem name="country_code">kor</ExtendedItem>
        <ExtendedItem name="rating">0</ExtendedItem>
        <ExtendedItem name="url"/>
        <ExtendedItem name="dlb">N</ExtendedItem>
        <ExtendedItem name="Ste">M</ExtendedItem>
        <ExtendedItem name="Rsl">S</ExtendedItem>
        <ExtendedItem name="prc">0</ExtendedItem>
        <ExtendedItem name="act"/>
        <ExtendedItem name="pvr">N</ExtendedItem>
        <ExtendedItem name="cap">N</ExtendedItem>
        <ExtendedItem name="dvs">N</ExtendedItem>
      <ExtendedDescription>
    </BasicDescription>
</ProgramInformation>
```

FIG.7B

```
- <ProgramInformation programId="crid://lguplus.com/00055360"fragmentId="0"
  - <BasicDescription>
      <Title lang="kor' type="main">ULALA KOREA(24)</Title>
      <ShortTitle lang='kor" type="main"/>
    - <Synopsis lang="kor" type="main">
        <![CDATA[No data ]]>
      <Synopsis>
      <Duration>PT00H30M00S</Duration>
    - <ExtendedDescription>
        <ExtendedItem name="content_nibble_level_1">0</ExtendedItem>
        <ExtendedItem name="content_nibble_level_2">132</ExtendedItem>
        <ExtendedItem name="user_nibble">0</ExtendedItem>
        <ExtendedItem name="user_nibble">5</ExtendedItem>
        <ExtendedItem name="country_code">kor</ExtendedItem>
        <ExtendedItem name="rating">0</ExtendedItem>
        <ExtendedItem name="url"/>
        <ExtendedItem name="dlb">N</ExtendedItem>
        <ExtendedItem name="Ste">M</ExtendedItem>
        <ExtendedItem name="Rsl">S</ExtendedItem>
        <ExtendedItem name="prc">0</ExtendedItem>
        <ExtendedItem name="dir"/>
        <ExtendedItem name="act"/>
        <ExtendedItem name="pvr">N</ExtendedItem>
        <ExtendedItem name="cap">N</ExtendedItem>
        <ExtendedItem name="dvs">N</ExtendedItem>
      <ExtendedDescription>
    </BasicDescription>
</ProgramInformation>
```

METHOD AND APPARATUS FOR ENCODING AND DECODING STRUCTURED DATA

CROSS-REFERENCE TO RELATED APPLICATIONS

This application claims priority to and the benefit of Korean Patent Application No. 10-2011-0094312 filed in the Korean Intellectual Property Office on Sep. 19, 2011, the entire contents of which are incorporated herein by reference.

TECHNICAL FIELD

The present invention relates to a method and apparatus for encoding and decoding data, and more particularly, to a method and apparatus for encoding and decoding structured data.

BACKGROUND ART

Due to recent development in communication technology, various data services have been developed and provided. Especially, due to the transition from analog to digital, broadcasting services have evolved to provide data services in an existing communication field, in addition to the support of various contents.

Recent smart TVs claim to support functions of freely retrieving and executing open contents or services over the Internet as well as services provided by broadcasters Accordingly, in order to retrieve various contents and services, Internet Protocol Television (IPTV), Internet TV, and smart TV operators tend to replace a service retrieval technology focusing on broadcasting with a web retrieval technology or extensible MarkUp Language (XML) type technology. Especially, TV-Anytime (TVA) has been used as a reference specification in many domestic and foreign standards, and also specifications of domestic IPTV and Digital Multimedia Broadcasting (DMB) are made with reference to the reference specification.

To provide a description through an example of TVA, the structures and tables of documents is defined for service retrieval information which is expressed with XML. Accordingly, definitions of various services and contents such as broadcasting, video on demand (VOD), and application are provided.

The XML based service retrieval information is described based on text, and thus has a great size of documents and a great amount of accessed information. Especially, broadcast services additionally support VOD or open contents, and thus efficient encoding and decoding methods are required for information such as the XML based service retrieval information in TVA.

SUMMARY OF THE INVENTION

The present invention has been made in an effort to provide a method and apparatus for efficiently encoding and decoding structured data.

An exemplary embodiment of the present invention provides a method of encoding structured data including fragmenting the structured data into fragments according to a configuration of the structured data; and encoding the fragments to generate encoded fragments using a string table including strings contained in the structured data.

Another exemplary embodiment of the present invention provides an apparatus for encoding structured data including a fragmentation unit fragmenting the structured data into fragments according to a configuration of the structured data; and an encoding unit encoding the fragments to generate encoded fragments using a string table including strings contained in the structured data.

Yet another exemplary embodiment of the present invention provides a method of decoding structured data including: receiving a data block including encoded fragments and fragment information about the encoded fragments, in which the encoded fragments are generated by fragmenting the structured data into fragments according to a configuration of the structured data, and encoding the fragments using a string table including strings contained in the structured data to generate the encoded fragments; and decoding the encoded fragments using the string table.

Still another exemplary embodiment of the present invention provides an apparatus for decoding structured data including: a receiving unit receiving a data block including encoded fragments and fragment information about the encoded fragments, in which the encoded fragments are generated by fragmenting the structured data into fragments according to a configuration of the structured data, and encoding the fragments using a string table including strings contained in the structured data to generate the encoded fragments; and a decoding unit decoding the encoded fragments using the string table.

According to exemplary embodiments of the present invention, which provide a method and apparatus for efficiently encoding and decoding structured data, it is possible to enhance operational efficiency of an entire system, such as a network bandwidth, memory, processing speed, etc.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 7A and 7B illustrate fragment redundancy for program information (PI) generated according to an IPTV content guide specification.

Figure 1:
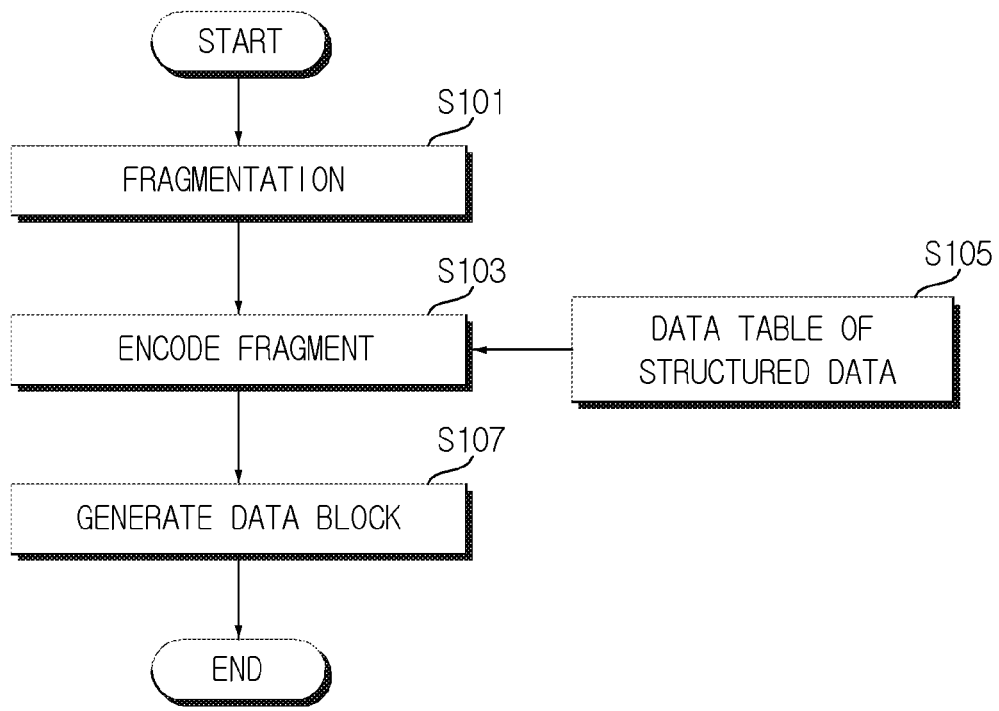
FIG. 1 illustrates a method of encoding structured data according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

DETAILED DESCRIPTION

The following descriptions will exemplify the principle of the present invention. Therefore, although not described and illustrated clearly in this specification, the principle of the present invention may be embodied and various apparatuses included in the concept and scope of the present invention may be invented by those skilled in the art. Conditional terms and embodiments enumerated in this specification are clearly intended only to make the concept of the present invention understood. It should be understood that the present invention is not limited to the enumerated embodiments and states.

It should be understood that all detailed descriptions in which specific embodiments as well as the principle, viewpoint, and embodiments of the present invention are enumerated are intended to include structural and functional equivalents. It should be understood that such equivalents include all elements which are developed to perform the same function as equivalents to be invented in the future as well as currently-known equivalents, that is, regardless of the structure.

Therefore, it should be understood that block diagrams of this specification illustrate the conceptual viewpoint of exemplary circuits for embodying the principle of the present invention. Similarly, it should be understood that flowcharts, state transition diagrams, pseudo codes and so on can be embodied as computer readable codes on computer readable recording mediums, and illustrate various processes which are performed by a computer or processor regardless of whether the computer or processor is clearly illustrated or not.

The functions of various elements illustrated in diagrams including processors or functional blocks indicated by a similar concept to the processors may be provided by the use of hardware having an ability of executing suitable software as well as dedicated hardware. When provided by processors, the functions may be provided by a single dedicated processor, a single common processor, or a plurality of individual processors. Some of the plurality of individual processors may be shared.

The use of processors, control, or terms presented as a similar concept to the processors or the control should not be analyzed by exclusively citing hardware having an ability of executing software. It should be understood that digital signal processor (DSP) hardware, ROM, RAM, and non-volatile memory for storing software are suggestively included without limitation. Other well-known hardware may also be included.

In the claims of this specification, it is intended that a component expressed as means for performing a function described in the detailed descriptions include combinations of circuit elements performing the function or methods of performing a function including all forms of software containing firmware and micro codes. The component is coupled to a proper circuit for executing the software to perform the function. In the present invention defined by such claims, functions provided by means enumerated in various manners are combined, and the component is combined with methods required by the claims. Therefore, it should be understood that any means capable of providing the function is equivalent to that grasped from this specification.

The above-described purpose, feature, and advantage will be clarified by the following detailed descriptions which are related to the accompanying drawings.

Accordingly, the technical spirit of the present invention can be easily embodied by those skilled in the art to which the present invention pertains. When it is determined that a specific description for a well-known technology related to the present invention may unnecessarily make the purport of the present invention ambiguous in the detailed descriptions of the present invention, the specific description will be omitted. Hereafter, exemplary embodiments of the present invention will be described in detail with reference to the accompanying drawings.

The description discloses a method and apparatus for encoding and decoding structured data according to the present invention.

The structured data means data which is created according to certain rules, including data with a hierarchy structure or tree structure. For example, the structured data may include Metadata, HyperText Markup Language (HTML) document, or XML document. The metadata is "structured data about data", which means data for describing other data.

The structured data includes data about a text document containing a string, which is not limited thereto. Accordingly, the present invention may be extensively applied to data about structured picture or image.

Various embodiments of the present invention will be described in detail with reference to the accompanying drawings.

FIG. 1 illustrates a method of encoding structured data according to an exemplary embodiment of the present invention.

Referring to FIG. 1, the method of encoding structured data includes fragmenting structured data into fragments according to a configuration of the structured data (S101), and encoding the fragments with a data table of the structured data (s105) to generate encoded fragments (S103).

The structured data may be divided according to the configuration of the data, such as a hierarchy structure or tree structure, and the data divided according to the configuration is referred to as a fragment. The fragmentation step S101 is a step of dividing the structured data into fragments, where the structured data is fragmented on the basis of the configuration such as the hierarchy structure or tree structure. In this case, a reference of the fragmentation may be set on the basis of the configuration such as the hierarchy structure or tree structure or generated by analyzing the structured data during encoding.

The structured data or fragment-constituted data corresponds to a number code, index, etc. in the data table of structured data, where data used repeatedly may be tabled. Data contained in the data table may be generated according to a preset reference or generated by analyzing the structured data during encoding. The data table may contain an element defined in a schema.

In this case, the structured data may include metadata, and the data table may include a table of strings included in the structured data.

The fragments may share the data table of the strings included in the structured data. According to an exemplary embodiment of the present invention, a string table may be stored as data, and an index corresponding to the string included in the string table may be further included. The fragments may use the string table by sharing one data with an index corresponding to the string.

The method of encoding the structured data according to an exemplary embodiment of the present invention may further include generating a data block including encoded fragments and fragment information about the encoded fragments (S107).

In this case, the data block may include the data table. When the data table is included in the data block and transmitted to a decoder, the decoder may decode the fragments with the received data table. If the decoder has already shared or held information about the data table in the encoder using the encoding method according to the exemplary embodiment of the present invention, the data table is not included in the data block, thereby reducing the size of the transmitted data.

The fragment information may include identification Information about the fragments of the data block. The identification information may further include location information about where the fragment is stored and version information about the fragment.

The data block may further include configuration information about the fragmented and structured data. In this case, the configuration information means configuration information about the structured data such as the hierarchy structure or tree structure, and the decoder decodes the structured data from the fragments, using the configuration information.

Figure 2:
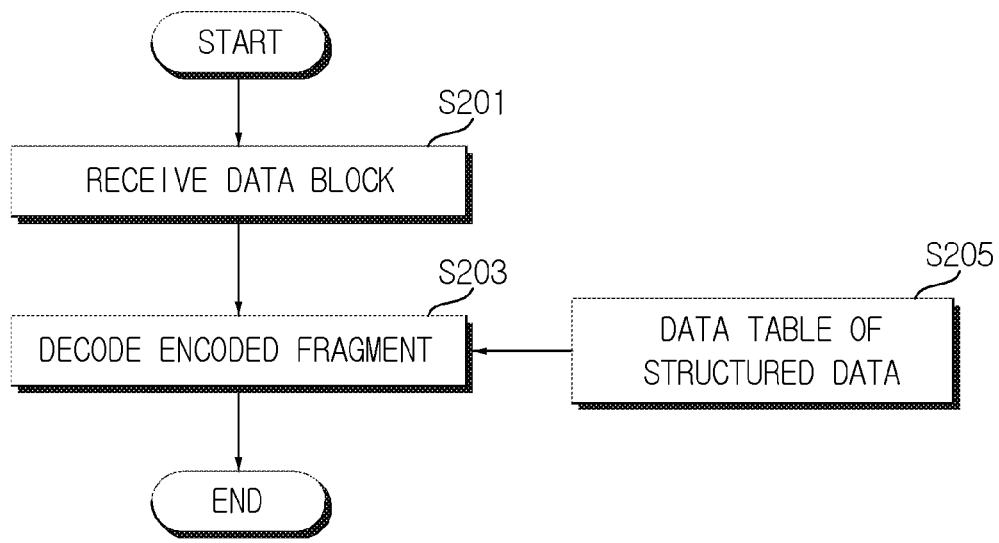
FIG. 2 illustrates a method of decoding structured data according to an exemplary embodiment of the present invention.

FIG. 2 illustrates a method of decoding structured data according to an exemplary embodiment of the present invention.

Referring to FIG. 2, the method of decoding the structured data includes receiving a data block including encoded fragments and fragment information about the encoded fragments (S201), where the encoded fragments are generated by fragmenting the structured data according to the configuration of the structured data and then encoding the fragment with the data table of the structured data, and decoding the encoded fragments (S203) with the data table (S205).

In this case, the structured data may include metadata, and the data table may include a table of strings included in the structured data.

The fragments may share the data table of the strings included in the structured data.

The data table may use previously stored information. For example, if the decoder which performs the decoding method according to the exemplary embodiment of the present invention has already shared or held information about the data table of the encoder, the decoder need not receive a separate data table, and thus may perform decoding without parsing the fragment to generate the data table.

The data block may further include the data table. In this case, the data table is loaded from the received data block to a memory, and the fragments are sequentially decoded. If an index for the corresponding element is detected in the encoded stream, a value corresponding to the data table is substituted for the index and then inserted into data to be decoded. Accordingly, the step of generating the data table from the encoded stream can be omitted, thus reducing a decoding time.

The fragment information may include identification information about the encoded fragments of the data block, and the data block may further include configuration information about the fragmented and structured data.

Detailed descriptions of the decoding steps corresponding to the encoding steps will be omitted.

Figure 3:
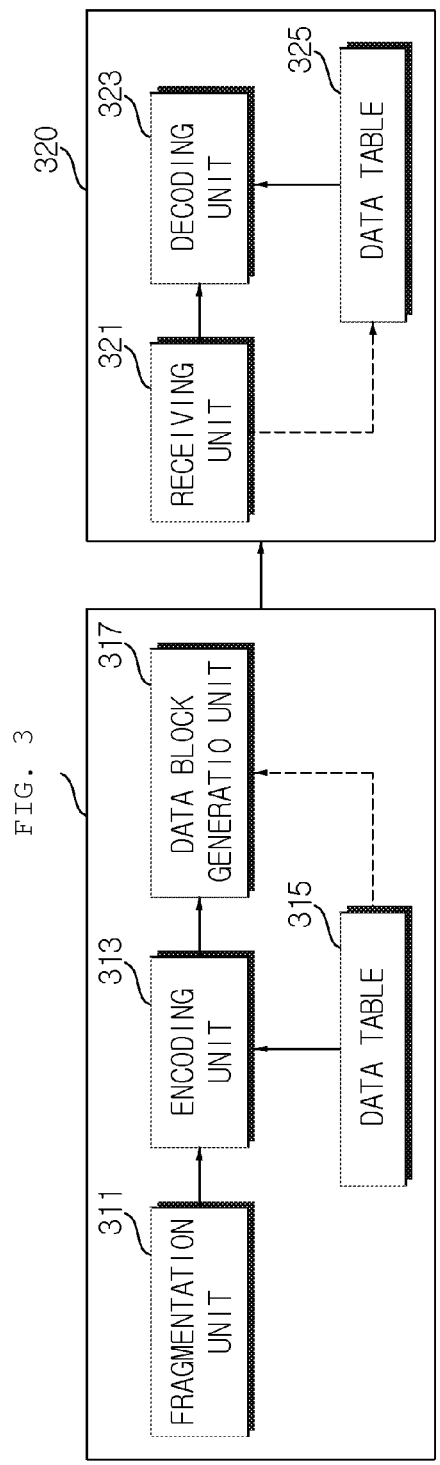
FIG. 3 illustrates an apparatus for encoding structured data and an apparatus for decoding structured data according to an exemplary embodiment of the present invention.

FIG. 3 illustrates an apparatus for encoding structured data and an apparatus for decoding structured data according to an exemplary embodiment of the present invention.

Referring to FIG. 3, the apparatus for encoding structured data 310 includes a fragmentation unit 311 fragmenting structured data according to a configuration of the structured data, and an encoding unit 313 encoding the fragments with a data table 315 of the structured data to generate encoded fragments.

In this case, the structured data may include metadata, and the data table 315 may include a table of strings included in the structured data. The strings may include a string of an element defined in the schema.

The apparatus for encoding the structured data may further include a data block generation unit 317 generating a data block including the encoded fragments and fragment information about the encoded fragments.

The data block may further include information about the data table 315, and the fragment information may include identification information about the fragments of the data block. The data block may further include configuration information about the fragmented and structured data.

In FIG. 3, a dotted line from the data table 315 to the data block generation unit 317 indicates a case where the data block further includes information about the data table.

The data block generated by the data block generation unit 317 is transmitted to an apparatus for decoding the structured data 320 over a network.

The decoding apparatus 320 receives the data block from the encoding apparatus 310 over a network. The decoding apparatus 320 includes a receiving unit 321 receiving a data block including encoded fragments and fragment information about the encoded fragments, where the encoded fragments are generated by fragmenting the structured data according to the configuration of the structured data and then encoding the fragment with the data table of the structured data, and a decoding unit 323 decoding the encoded fragments with the data table (325).

In this case, the structured data may include metadata, and the data table 325 may include a table of strings included in the structured data. The strings may include a string of an element defined in the schema.

The data table 325 may be previously stored information in the decoding apparatus 320, or the information about the data table may be information about the data table 315 of the encoding apparatus 310, which may be included in the data block and received.

The fragment information may include identification information about the encoding fragments of the data block, and the data block may further include configuration information about the fragmented and structured data.

In FIG. 3, a dotted line from the receiving unit 321 to the data table 325 indicates a case where the received data block further includes information about the data table from the encoding apparatus 310.

The encoding apparatus 310 and the decoding apparatus 320 are described in the method of encoding and decoding the structured data, and thus detailed descriptions thereof will be omitted.

Specific Exemplary Embodiment

A specific exemplary embodiment of the present invention will exemplify a TVA specification.

Figure 4:
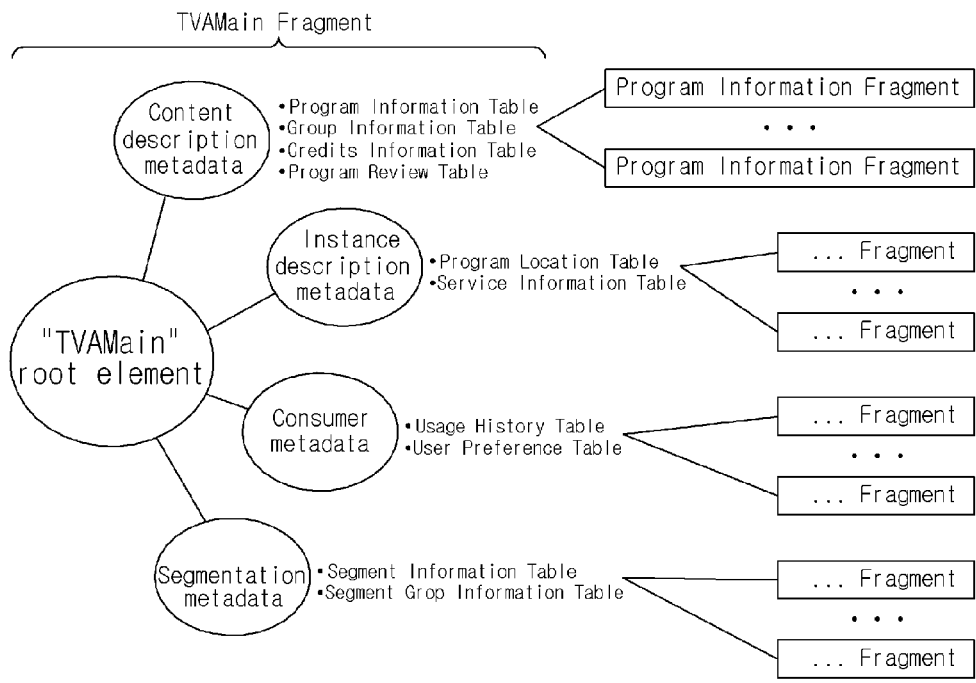
FIG. 4 illustrates types and structures of documents in TVA.

FIG. 4 illustrates types and structures of documents in TVA.

Referring to FIG. 4, '"TVAMain" root element' is in the tree structure, which includes 'Content description metadata', 'Instance description metadata', 'Consumer metadata', and 'Segmentation metadata'. Each element has a sub-tree structure. For example, 'Content description metadata' includes 'Program Information Table', 'Group Information Table', 'Credits Information Table', 'Program Review Table', etc. The 'Program Information Table' includes sub-fragments.

In this case, layers including '"TVAMain" root element', 'Content description metadata', and 'Program Information Table' are classified as TVAMain fragments, and lower layers of 'Program Information Table' are classified as fragments.

Figure 5:
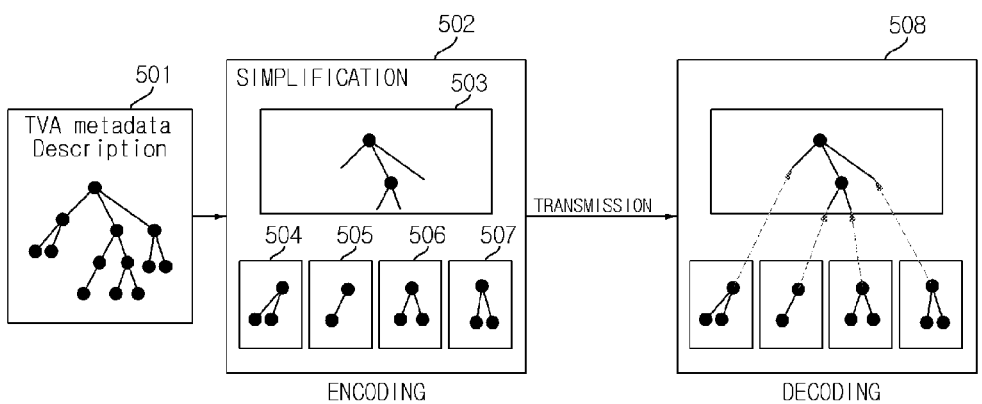
FIGS. 5 and 6 illustrate fragmentation and encapsulation in TVA.
Figure 6:
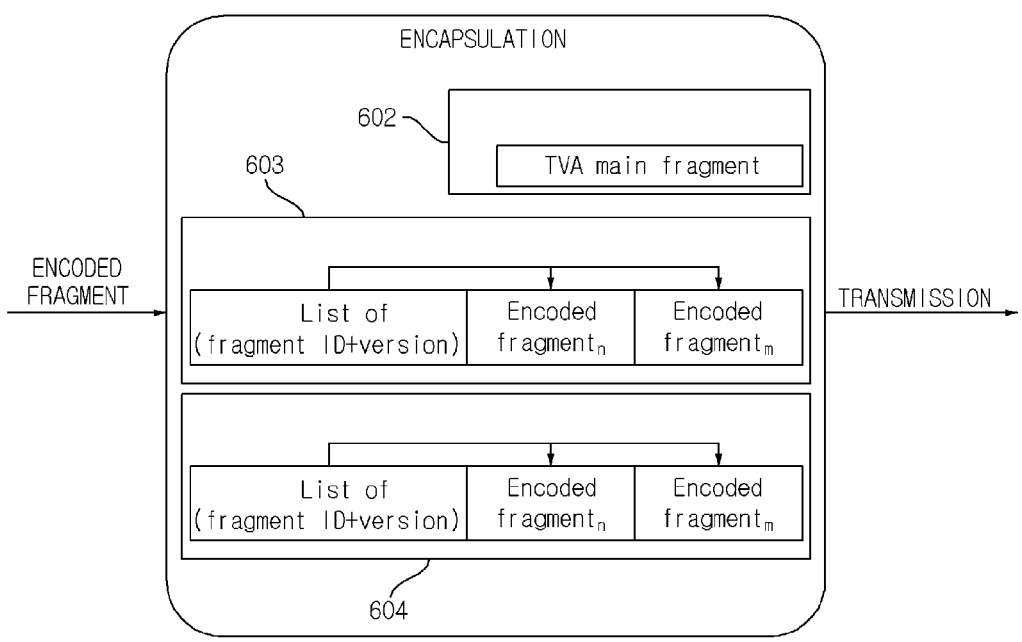

FIGS. 5 and 6 illustrate fragmentation and encapsulation in TVA.

A technology for encapsulating XML documents with encoding and indexing is defined in TVA. The encapsulation means dividing an XML document of a non-linear tree form into independent entities, reducing a size of each entity through a compression algorithm, inserting an encoded document into a block, which is called a container, and writing configuration information into a container header.

Referring to FIG. 5, a structured document 501 such as TVA metadata description is fragmented 502 into TVAMain fragment 503 and its low fragments 504, 505, 506, and 507, transmitted to a block 601 as described in FIG. 6 in a form of container 602, 603, 604. The received block is decoded to restore the original structured document 508. In FIG. 6, three containers 602, 603, and 605 are encapsulated. The first container 602 include TVA main fragment, and the second and third containers 603 and 604 include a predetermined group of fragments and fragment ID and version information of the fragments.

During the encapsulation process, in order to reduce the size of each XML document, the XML document is compressed with an encoding algorithm, and a compression efficiency varies depending on the encoding algorithm. Generally, GZIP (GNU ZIP) is widely used, and various algorithms such as Fast-Info set, BiM (Binary format of Metadata), and EXI (Efficient XML Interchange) have also been proposed.

Most algorithms adopt a scheme of analyzing patterns of information included in the XML and, if there is the same pattern, replacing the pattern with the corresponding encoding information to reduce the size of the document. For example, if there are several strings of aaa in the XML document, a first string of aaa is put in an encoding stream, and inserted into the string table. The next strings of aaa are replaced with an index of the string table and then put in the encoding stream. Accordingly, aaa is converted into a number code, thus relatively reducing the size.

Generally, the efficiency of the encoding algorithm is closely associated with the size of the document. That is, as the size of the document is greater, the same information pattern may be more frequent, thus increasing the encoding efficiency.

FIGS. 7A and 7B illustrate fragment redundancy for program information (PI) generated according to an IPTV content guide specification. FIG. 7A illustrates a program information fragment for "SISAWIDE LIVE YEOUIDO JOURNAL", and FIG. 7B illustrates a program information fragment for "ULALA KOREA (24)". Comparing FIG. 7A with FIG. 7B, information for describing contents such as genre or resolution is overlapped for each content.

According to a TVA metadata transmission model, the entire description 501 as shown in FIG. 5 is fragmented and divided in fragment units 503, 504, 505, and 506. When this is applied to program information, the program information is divided in a unit for description of each content. Accordingly, if the entire description is encoded with the encoding algorithm, information is encoded for each fragment even when the information has the same value as that of an element such as genre, resolution, grade, etc. and thus may be replaced with an index. Accordingly, the compression efficiency is significantly reduced, and thus a terminal user and a service provider have an increasingly great burden for network bandwidth and memory.

Generally, as the result of an analysis of program information documents in 2010 which is provided by BBC, the fragment has a size of 1 to 2 KB, and the description has a size ranging from 1 KB to 64 KB. In a case of the description of 64 KB, the document size was reduced by one-twentieth with GZIP algorithm and by one-fortieth with EXI. However, if the description is divided into fragments and encapsulated, the compression rate of each fragment is that of the entire description. That is, the document is compressed and thus the size is reduced by two-third with GZIP and by half with EXI. This is caused by encoding the divided fragment of 1 to 2 KB to reduce the effect of the compression.

The method according to the present invention includes the string table which may be shared by each fragment, in a container including TVA fragments in block units. An encoding and decoding structure is designed such that the fragments included in the containers are put in one logical and great description document to share one character table, thereby enhancing the encoding efficiency for redundant strings.

Figure 8:
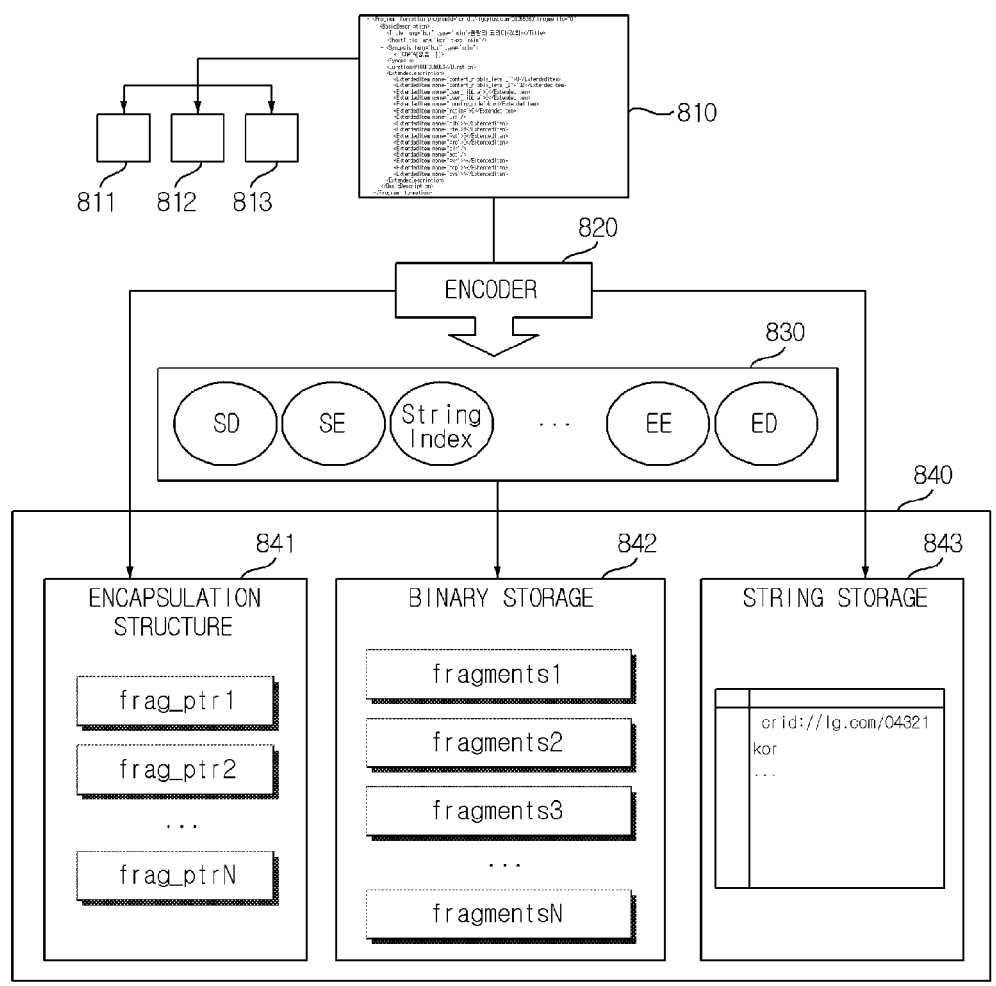
FIG. 8 illustrates an example of an EXI encoding applied according to an exemplary embodiment of the present invention.

FIG. 8 illustrates an example of an EXI encoding applied according to an exemplary embodiment of the present invention. The method and apparatus according to the present invention may be applied to all encoding algorithms using a string table in addition to the EXI encoding method.

Referring to FIG. 8, a program information document 810 is fragmented into a plurality of fragments 811, 812, and 813. The fragments 811, 812, and 813 are encoded by an EXI encoder 820 in EXI stream 830. A data container 840 conforms to the standard defined in TVA and includes an encapsulation structure 841, a binary storage 842, and a string storage 843.

The encapsulation structure 841 includes location information about which location of the binary storage 842 the fragments 811, 812, and 813 are stored, version information, and identifier, which may be managed. The encoded fragments are sequentially stored in the binary storage 842, and string values in the fragments are stored as one string table in the string storage 843. The string table may be converted in a binary form and stored to the binary storage (842).

Accordingly, when the fragments 811, 812, and 813, which are included in the data container 840, share the string table and have the same string value, the string value is replaced with an index in the shared string table during encoding and inserted into an encoding stream, thus enhancing the compression efficiency. An existing algorithm manages information for configuration of a string table for each fragment, thereby eliminating redundancy in string, which may exist between the fragments, and thus reducing the efficiency.

During decoding, the decoding apparatus receives the data container 840, loads the string table of the string storage 843 to the memory, sequentially decodes fragments, and, if the index is detected in the encoding stream, substituting the index with a string value corresponding to the index in the shared string table and then inserting the value into the XML document. Accordingly, even the step of generating the string table from the encoded stream such as the original algorithm is omitted, thus advantageously reducing a decoding time.

Additionally, when a name of an element in the schema, such as Fast-Info set, is also managed with the string table, a time for parsing the fragment and generating the string table may be saved by previously putting the name of the element into the string table through the schema.

Especially, when a terminal including a decoder has the same schema, the name of the element described in the schema is not included in the string storage but automatically generated in the terminal or previously stored. Thus, the size of the shared string table may be reduced, and a procedure for generating the string table during encoding may be simplified.

Finally, according to the present invention, it is possible to maximally prevent a loss of encoding efficiency during a process of fragmenting TVA description, inserting the fragments into the encapsulation structure, and transmitting the fragments.

Especially, when both elements and values are encoded using an encoding algorithm having the string table, such as Fast-Info set, the advantageous effect may be significantly high. When a type of element value is a string, such as EXI or WBXML, the string table is used, thereby enhancing the compression efficiency.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method of encoding structured data comprising:
   fragmenting the structured data into fragments according to a configuration of the structured data; and
   encoding the fragments using a string table including strings contained in the structured data to generate encoded fragments,
   wherein the fragments are classified into fragmentation units based on a hierarchical layer of content within the structured data.

2. The method of claim 1, wherein the structured data comprises metadata, and the string table is shared by the fragments.

3. The method of claim 1, wherein the string table further comprises an index corresponding to the string.

4. The method of claim 1, further comprising:
   generating a data block including the encoded fragments and fragment information about the encoded fragments.

5. The method of claim 4, wherein the data block further comprises the string table.

6. The method of claim 4, wherein the fragment information comprises identification information about the fragments of the data block.

7. The method of claim 5, wherein the data block further comprises configuration information about the fragmented and structured data.

8. An apparatus for encoding structured data comprising:
   a fragmentation unit to fragment the structured data into fragments according to a configuration of the structured data; and
   an encoding unit to encode the fragments using a string table including strings contained in the structured data to generate encoded fragments,
   wherein the fragments are classified into fragmentation units based on a hierarchical layer of content within the structured data.

9. The apparatus of claim 8, further comprising:
   a data block generation unit to generate a data block including the encoded fragments and fragment information about the encoded fragments.

10. A method of decoding structured data comprising:
    receiving a data block including encoded fragments and fragment information about the encoded fragments, wherein the encoded fragments are generated by fragmenting the structured data into fragments according to a configuration of the structured data, and encoding the fragments using a string table including strings contained in the structured data to generate the encoded fragments; and
    decoding the encoded fragments using the string table,
    wherein the fragments are classified into fragmentation units based on a hierarchical layer of content within the structured data.

11. The method of claim 10, wherein the structured data comprises metadata, and the string table is shared by the fragments.

12. The method of claim 10, wherein the string table further comprises an index corresponding to the string.

13. The method of claim 10, wherein the data table uses previously stored information.

14. The method of claim 10, wherein the data block further comprises the string table.

15. The method of claim 10, wherein the fragment information comprises identification information about the encoded fragments of the data block.

16. The method of claim 10, wherein the data block further comprises configuration information about the fragmented and structured data.

17. An apparatus for decoding structured data comprising:
    a receiving unit to receive a data block including encoded fragments and fragment information about the encoded fragments, wherein the encoded fragments are generated by fragmenting the structured data into fragments according to a configuration of the structured data, and encoding the fragments using a string table including strings contained in the structured data to generate the encoded fragments; and
    a decoding unit to decode the encoded fragments using the string table,
    wherein the fragments are classified into fragmentation units based on a hierarchical layer of content within the structured data.

18. The apparatus of claim 17, wherein the string table uses previously stored information.

19. The apparatus of claim 17, wherein the data block further comprises the string table.

* * * * *